United States Patent
Lazar et al.

(10) Patent No.: US 10,295,622 B2
(45) Date of Patent: May 21, 2019

(54) SIGNALING A TUNING OF ADJUSTMENT PARAMETERS OF A COIL ARRANGEMENT

(71) Applicants: Razvan Lazar, Erlangen (DE); Paul Yoe, Eckental (DE)

(72) Inventors: Razvan Lazar, Erlangen (DE); Paul Yoe, Eckental (DE)

(73) Assignee: Siemens Aktiengesellschaft, München (DE)

( * ) Notice: Subject to any disclaimer, the term of this patent is extended or adjusted under 35 U.S.C. 154(b) by 895 days.

(21) Appl. No.: 14/640,728

(22) Filed: Mar. 6, 2015

(65) Prior Publication Data

US 2015/0253395 A1   Sep. 10, 2015

(30) Foreign Application Priority Data

Mar. 6, 2014 (DE) .................. 10 2014 204 145

(51) Int. Cl.

| G01R 33/36 | (2006.01) |
| --- | --- |
| G01R 33/34 | (2006.01) |
| G01R 33/56 | (2006.01) |
| G01R 33/58 | (2006.01) |
| G01R 33/54 | (2006.01) |

(52) U.S. Cl.
CPC ... *G01R 33/3628* (2013.01); *G01R 33/34092* (2013.01); *G01R 33/546* (2013.01); *G01R 33/5608* (2013.01); *G01R 33/3642* (2013.01); *G01R 33/543* (2013.01); *G01R 33/583* (2013.01)

(58) Field of Classification Search
CPC .......... G01R 33/34092; G01R 33/3628; G01R 33/3642; G01R 33/543; G01R 33/546; G01R 33/5608; G01R 33/583
See application file for complete search history.

(56) References Cited

U.S. PATENT DOCUMENTS

| 5,483,158 A | 1/1996 | van Heteren et al. | |
| --- | --- | --- | --- |
| 6,054,858 A * | 4/2000 | Dumoulin .......... | G01R 33/3628 324/314 |
| 2008/0204028 A1 | 8/2008 | DeVries et al. | |
| 2012/0032678 A1* | 2/2012 | Vaughan, Jr. ...... | G01R 33/3415 324/318 |
| 2012/0161771 A1* | 6/2012 | Apostolos ............ | G01R 33/441 324/322 |

(Continued)

OTHER PUBLICATIONS

Demaw, D. "1st Steps in Radio. 16. Resonance and Tuning Methods." QST 69.4 (1985): 28-31. (Year: 1985).*

(Continued)

*Primary Examiner* — Rishi R Patel
(74) *Attorney, Agent, or Firm* — Lempia Summerfield Katz LLC

(57) ABSTRACT

A method for signaling a tuning of an adjustment parameter of an antenna coil arrangement of a magnetic resonance tomograph includes detecting a deviation between an actual adjustment value of at least one adjustment parameter and a required adjustment value of the at least one adjustment parameter. As a function of the deviation, an acoustic and/or a mechanical signal is output in real time to an operator. A device for signaling a tuning of an adjustment parameter of a coil arrangement of a magnetic resonance tomograph, and a magnetic resonance tomograph operating according to the method and/or containing the device are described.

20 Claims, 1 Drawing Sheet

(56) References Cited

U.S. PATENT DOCUMENTS

2013/0063147 A1* 3/2013 Findeklee .......... G01R 33/3642
                                                              324/309
2013/0116546 A1* 5/2013 Requardt ............... A61B 5/055
                                                              600/414

OTHER PUBLICATIONS

German Office Action for German Application No. 10 2014 204 145.7, dated Oct. 29, 2014, with English Translation.

* cited by examiner

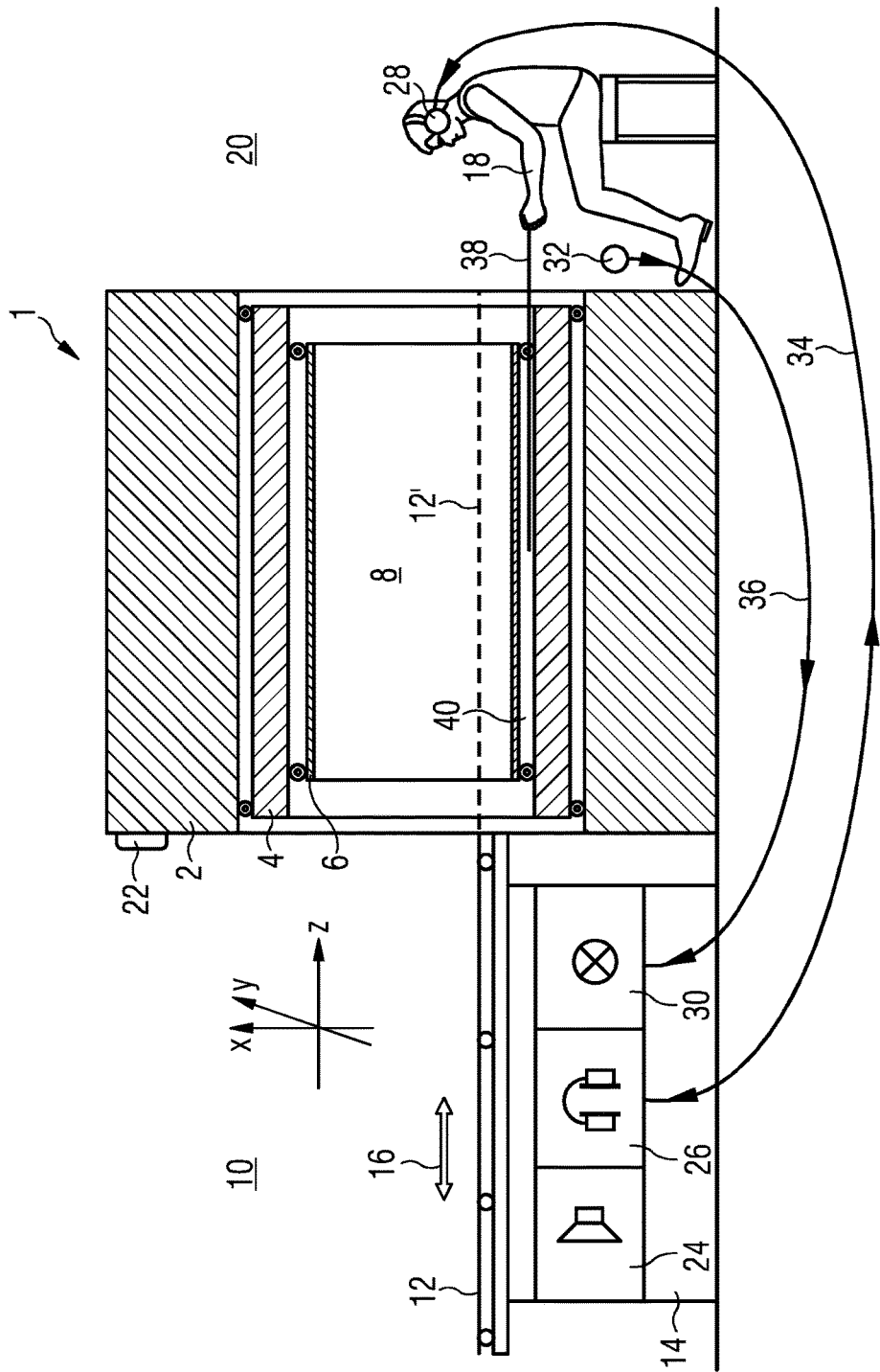

SIGNALING A TUNING OF ADJUSTMENT PARAMETERS OF A COIL ARRANGEMENT

RELATED APPLICATIONS

This application claims the benefit of German Patent Application No. DE 102014204145.7, filed Mar. 6, 2014. The entire contents of the priority document are hereby incorporated herein by reference.

TECHNICAL FIELD

The present teachings relate generally to a method and a device for signaling a tuning of adjustment parameters of a coil arrangement (e.g., an antenna coil arrangement, such as a body coil or BC), and also to a magnetic resonance tomograph (MRT) operating in accordance with the method and/or containing the device.

BACKGROUND

A conventional, roughly circular cylindrical magnetic resonance tomograph (MRT) includes, from a radially outer side to a radially inner side, a basic magnetic field coil for creating a constant permanent-magnetic or electromagnetic basic field (B0), three gradient coils for creating linearly increasing or decreasing electromagnetic gradient fields (Bx, By, Bz) in the three spatial directions x, y, z, and a substantially cylindrical body coil (BC) for creating an electromagnetic RF alternating field (B1) via at least one RF feed line. The body coil (BC) may be operated as a transmit and/or receive antenna (e.g., a transmit antenna). In the inner chamber of the magnetic resonance tomograph surrounded by the coils (a.k.a. the patient tunnel), a patient table may be moved into the tunnel from the patient side and moved out of the tunnel again. The MRT scan is performed while the patient table is moving or at a standstill. Smaller local coils (LC) that may be operated as transmit and/or receive antennae (e.g., receive antennae) may be disposed on the patient table or on the patient.

The body coil (BC) is formed from copper or a similar material and may be configured as a birdcage antenna. The BC may have two end rings with a plurality (e.g., 4, 8, 16 or 32) of rungs lying between the two end rings. This structure may be applied as copper wires to a cylindrical tube as a type of circuit board. Both the end rings and the rungs have various electrical components (including capacitors) that have the effect of electrically separating the part sections of the end rings or rungs. A few of the capacitors are configured as trimmer capacitors. The trimmer capacitors have capacitor plates that may be rotated in relation to one another. The capacitance C of the trimmer capacitors may be varied through the capacitor plates. As a result, the electrical resonant circuit (e.g., the body coil BC, electrical components and RF feed lines of the BC, and one of the two or more RF voltage sources) may be changed and brought into resonance as a function of the radio frequency voltage applied in a process referred to below as the "tuning process" or "tuning." Only physical variables of the electrical components of the electrical resonant circuit are changed (e.g., the capacitances of the trimmer capacitors).

A tuning process of a type described above is performed after manufacture and during commissioning of the MRT, and also at regular intervals during operation (e.g., about every 6 months) by a service person.

The tuning of the BC is a tedious, multidimensional process that is performed by a service engineer under great stress and time pressure. The main work sequence involves turning the variable capacitors or capacitances (e.g., trimmer capacitors) of the BC to maintain the resonant frequencies and the decoupling factor of the manufacturer's specification/requirements. At present, a BC has two feed channels that are largely tuned individually. As a result, a mutual coupling (also called "decoupling") of the RF feed channels is adjusted.

On the service side opposite the patient side, a service person turns the trimmer capacitors between the gradient coil system and the BC with a very long screwdriver of about 50 cm, and reads off the new values from a display of the console on the patient side. This process may be repeated 3 to 7 times for each radio frequency to be tuned. The same process may also be performed for the decoupling of the RF feed channels. Sometimes, after a good decoupling has been achieved, the frequencies are tuned again even more finely since one tuning affects the other tuning.

In most current devices, the number of RF feed channels to be tuned is only two. However, multi-channel systems (e.g., eight channels or more) exist. The tuning of such multi-channel systems is difficult since all RF feed channels are tuned individually and, in each case, decoupled in relation to one another.

A problem in the conventional tuning method (e.g., sitting down, turning the capacitors, standing up, pressing the button and waiting for results) is that real-time information is not fed back to the service person. In addition to the large amount of time expended, the method does not deliver any immediate feedback about the result of the tuning to the service person. Since the service person receives the result only after a delay (e.g., going to the front side of the magnets, pressing the button, and waiting), the results of the service person's tuning efforts cannot form a feedback loop (e.g., with the service person located in the middle).

Another problem is that the service person is forced to remember the old numbers of a previous tuning process and to perform mental calculations to decide whether a tuning being performed is in the right direction for improvements or is moving away from the specification/requirement.

A further problem is that the service person is working with a screwdriver close to parts (e.g., electrical lines of the gradient coils) that carry high voltages when the magnetic resonance tomograph is operating. Although these areas are grounded during the tuning, a high level of concentration is called for by the service person that is visually focused on the area wherein the screwdriver is being used.

SUMMARY AND DESCRIPTION

The scope of the present invention is defined solely by the appended claims, and is not affected to any degree by the statements within this summary.

The present embodiments may obviate one or more of the drawbacks or limitations in the related art. For example, in some embodiments, a method and a device are provided for signaling tuning of a number of adjustment parameters (e.g., resonance variables and/or decoupling variables of electrical resonant circuits of electrical components of a coil arrangement, such as an antenna coil arrangement of a magnetic resonance tomograph). The tuning in accordance with the present teachings may be performed more quickly, more easily, and with higher quality as compared to conventional tuning.

The service person does not need specific information about how the resonant frequency (e.g., minimum reflection) changes while the variable capacitors/capacitances are being adjusted. This information is referred to in function specifications/requirements from MRT manufacturers. If the variable capacitors are turned in the clockwise direction, the capacitance increases and, therefore, the resonant frequency is lowered.

However, the service person may need information about where the resonant frequency is in relation to the values in the specification/requirements. Thus, some sort of feedback about the service person's actions and, if available, an indication of whether the service person has achieved or exceeded an objective, may be needed. In this manner, the service person may tune to beyond the values of the specification/requirements, receive a message that the values of the specification/requirement have been exceeded, and return to the optimum point in a controlled manner.

For tuning the decoupling, there is no set strategy as to how the variable capacitors/capacitances are turned in a specific direction. For this tuning process, the service person is forced to rely on a time-consuming trial-and-error strategy. Thus, a type of feedback that shows the service person how to proceed would be helpful. In accordance with the present teachings, a real-time tuning aid (e.g., for a body coil BC) with acoustic feedback may be used to facilitate the tuning adjustment.

The RF frequency of a BC to be defined varies in a frequency range from about 1 MHz around a predetermined average frequency. The average frequency depends on the magnetic field strength (e.g., 1T=40 MHz, 1.5T=60 MHz, 3T=120 MHz at the Larmor frequency for protons). The term "tuning" refers to a process whereby the service person brings the resonant frequency of each RF channel of the BC within a specified/required tolerance band close to the average Larmor frequency of the respective system. The specification/requirement encompasses a few hundred kHz close to the average frequency of the system.

The decoupling is defined by the magnitude that also has a frequency component. The magnitude of the decoupling corresponds to the voltage that is transmitted from one RF feed channel to another (e.g., neighboring RF feed channel). Thus, the specification/requirement calls for the service person to tune the decoupling in the direction of a 2D box within a frequency-magnitude diagram.

The position of the decoupling curve on the frequency scale may provide additional information of some interest to the service person. For example, the service person may use the information that the maximum of the decoupling is located at a higher frequency in relation to the average frequency of the system. However, the frequency of the coupling is not a strict requirement as long as the magnitude is within the specification/requirement limits.

A method in accordance with the present teachings for signaling a tuning of a number of adjustment parameters of a coil arrangement (e.g., antenna coil arrangement, such as an RF coil arrangement) of a magnetic resonance tomograph (MRT) contains the following acts: (a) detecting (e.g., measuring) an actual adjustment value; (b) providing a required adjustment value (e.g., from a memory of a database) that is predefined and/or that has been established statistically from prior measurements; (c) calculating a deviation between the actual adjustment value of at least one adjustment parameter and a required adjustment value of the adjustment parameter; (d) outputting an acoustic and/or mechanical signal in real time to an operator (e.g., the service person) currently performing the tuning based on the deviation.

The act (b) may also be performed at any given prior point in time, (e.g., before act (a)).

The acoustic and/or mechanical signals to be output for signaling the tuning of the number of adjustment parameters may be determined before and/or during the method in an automated or semi-automated manner, or defined by the operator.

The adjustment parameters may be a resonant frequency (e.g., of a resonant circuit with electrical components such as, for example, capacitors, inductors and impedances of an RF coil, such as a BC and/or LC) or may be the reflection factor and/or decoupling factor.

The coil arrangement may contain an RF antenna arrangement (e.g., the body coil BC) of the magnetic resonance tomograph. However, the method may also be used with local coils (LC) or remote body arrays (e.g., when the arrays are built permanently into the magnetic resonance tomograph). In addition to use for RF antenna arrangements, the present teachings may also be used for tuning a number of gradient coil arrangements (Bx, By, Bz) of the three spatial directions (x, y, z) of the magnetic resonance tomograph (MRT). A conventional gradient coil arrangement of an MRT forms a contiguous unit. The contiguous unit has a plurality of winding units, and may be adjusted spatially by positional changes. Thus, tuning in accordance with the present teachings is unnecessary, even if such tuning were an option.

The acoustic signal may be a simple sine wave tone changing with the tuning, or two sine-wave tones. In the case of two sine-wave tones, one sine-wave tone is constant and the other sine-wave tone changes with the tuning. The operator endeavors to match the two sine-wave tones. The acoustic signal may also be a tone burst in pulse form or one or more tone bursts in pulse form (e.g., a sequence of pulses with changing pulse widths and/or pulse sequences).

The same or similar description provided above in reference to an acoustic signal also applies for a mechanical signal.

The signal is output to an operator in real time (e.g., substantially in real time), such that the adjustment process that the operator is to complete (e.g., turning a trimmer capacitor) may also be completed meaningfully. The operator may hear the signal at a point in time during the adjustment process when the operator may interrupt or end the adjustment process without the adjustment value changing significantly.

A device in accordance with the present teachings for signaling tuning of a number of adjustment parameters of a coil arrangement of a magnetic resonance tomograph (MRT) may be used in the above-described method. The device includes: (a) a detection unit configured for detecting an actual adjustment value of at least one adjustment parameter; (b) an establishing unit configured for establishing a deviation of the detected actual adjustment value of the adjustment parameter from a predefined required adjustment value of the adjustment parameter; and (c) a signal generation unit configured for outputting an acoustic and/or a mechanical signal in real time to an operator, based on the deviation.

To provide a required adjustment value, which may be predefined and/or established statistically from prior measurements, the device may also have a provision unit (e.g., with a memory and a database). In addition, for automated determination of an acoustic and/or mechanical signal to be output, for semi-automated determination, or for determination defined by the operator, the device may include a determination unit. The device may further include an output unit configured for output of the acoustic and/or mechanical signal to the operator in real time as a function of the deviation. As explained below, an output unit of the magnetic resonance tomograph that is already present for other purposes may be used.

Similarly, the detection unit and/or provision unit and/or establishing unit may be a measurement device already present in a conventional MRT. Alternatively, an additional measurement device that is built into the conventional MRT or connected externally to the tomograph for signaling purposes may be provided.

The output unit for creation or output of the acoustic and/or mechanical signal may already be present in a conventional MRT in the form of room loudspeakers and/or patient headphones. The determination unit and/or signal generation unit may additionally be introduced or retrofitted as hardware and/or software.

A magnetic resonance tomograph (MRT) operating in accordance with the above-described method is provided, as is a magnetic resonance tomograph (MRT) that includes the above-described device.

The above-described components of the device (e.g., the detection unit, the provision unit, the establishing unit, the determination unit and/or the signal generation unit) may be realized wholly or in part in the form of software modules in a processor of a corresponding control device of a magnetic resonance tomograph. A software installation may be used to allow control devices that are already present to be upgraded for performing a method in accordance with the present teachings. Thus, a computer program product that is able to be loaded directly into the processor of a programmable control device of a magnetic resonance tomograph is provided. The computer program product is provided with program code for executing all acts of a method in accordance with the present teachings when the computer program is executed in the control device.

Representative embodiments and developments in accordance with the present teachings are further described below. Features of different embodiments may be combined.

In some embodiments, a resonant frequency of at least one coil of the coil arrangement is an adjustment parameter. The resonant frequency is the frequency at which the amplitude of the resonance reaches a maximum. A plurality of resonant frequencies may exhibit the maximum. The known "Thomson's resonance equation" applies to an electrical resonant circuit with electrical components containing capacitances and inductances.

The desired resonant frequency may be set within a certain tolerance range by using trimmer capacitors as variable electronic components. The capacitance may repeatedly be varied manually and/or automatically.

As an alternative or in addition to the resonant frequency, a reflection factor (e.g., an amplitude ratio of reflected wave to incident wave on transition from one propagation medium to another) may be included as an adjustment parameter.

As an alternative or in addition to the resonant frequency, a transmission factor (e.g., an amplitude ratio of transmitted wave/wave passing through to incident wave on transition from one propagation medium to another) may also be included as an adjustment parameter.

In some embodiments, a decoupling factor between at least two coils of the coil arrangement is the adjustment parameter, as described above.

The decoupling factor is a measure for the decoupling or coupling of two electrical conductors (e.g., feed lines of RF transmit antennae). A combined wave coupling of inductive and capacitive coupling is involved. The term "coupling" refers to the crossing of electromagnetic waves from one line or one circuit to a neighboring line or circuit.

The decoupling factor to be adjusted may be tuned such that the actual adjustment value lies within a predefined frequency-magnitude range of a 2D box in a frequency-magnitude diagram. The decoupling factor to be adjusted cannot be chosen at random. Rather, the decoupling factor relates to a predefined frequency band with predefined amplitude values.

In some embodiments, an adjustment parameter is assigned a characteristic variable of the output signal to be varied as a function of the deviation. For example, the output of the acoustic and/or mechanical signal may depend on the amount of the difference between the actual adjustment value and the required adjustment value. A tone output of the signal may, for example, increase in volume and/or pitch and/or pulse frequency as the required resonant frequency to be adjusted is approached. The tone output of the signal may decrease in volume and/or pitch and/or pulse frequency as the adjustment moves further away.

Different adjustment parameters may be assigned different characteristic variables. For example, as described above, the required resonant frequency to be adjusted may be assigned the pitch as an adjustment value, the required decoupling factor to be adjusted may be assigned the volume, or vice versa. All the assignment of options may be predefined by the manufacturer of the MRT and/or may be selected by the operator of the MRT (e.g., via a selection menu).

A characteristic variable of the output signal is selected from the group consisting of: a basic frequency of the output signal (e.g., the pitch), an amplitude of the output signal (e.g., objective volume or average or operator-related subjective volume sensitivity), a repetition frequency of a pulse sequence of the output signal, a pulse number of a pulse sequence of the output signal, and a beat of at least two overlaid output signals.

In some embodiments, two or more of the above-described characteristic variables to be varied may be selected.

In some embodiments, the adjustment parameter is at least one resonant frequency of an electrical resonant circuit of a variable electrical component (e.g., capacitors, inductors, impedances, semiconductor chips, ICs). For example, the resonant circuits may contain an RF voltage source (e.g., a coil, such as a body coil BC), electrical components of the coil, and RF feed channels for the coil.

By changing a number of electrical variables that affect the resonant circuit (e.g., capacitance, inductance, impedance) of the variable electrical components (e.g., changing the capacitance of the trimmer capacitor), an actual resonant frequency is brought into a tolerance frequency range predefined around an average required resonant frequency. The average required resonant frequency corresponds, for example, to the Larmor frequency of the MRT (e.g., at 40, 60 or 120 MHz). The predefined tolerance frequency range lies, for example, between a few 100 kHz and 1 MHz.

A predefined or adjustable approximation of the actual resonant frequency to the tolerance frequency range and/or to the required resonant frequency may be displayed to the user by the output acoustic and/or mechanical signal.

For example, the difference between the actual resonant frequency and an average required resonant frequency may be displayed. The output signal changes when there is a change in the difference between the actual resonant frequency and the average required resonant frequency. A pitch may thus increase when the actual resonant frequency approaches the required resonant frequency, and may decrease when the actual resonant frequency moves away from the required resonant frequency.

Alternatively, instead of the difference, the sum, the product, or the quotient of the actual resonant frequency and the average required resonant frequency may be displayed by the output signal instead. The output signal changes when the sum, the product, or the quotient changes.

The change in the pitch may be performed symmetrically to the required resonant frequency.

If resonant frequencies and/or the coupling factors are selected as adjustment parameters for a tuning, several options are available as described below.

For tuning a plurality of resonant frequencies of RF feed channels of an RF coil, each resonant frequency of each RF feed channel may be tuned individually per se by applying an RF feed voltage to the respective resonant frequency. The other resonant frequencies of the other RF feed channels that are not to be tuned are not active, or the other RF feed channels are not supplied with the RF feed voltage.

For tuning a plurality of resonant frequencies of RF feed channels of an RF coil, a plurality of resonant frequencies of each RF feed channel may be tuned by applying an RF feed voltage to thee plurality of resonant frequencies. The other resonant frequencies of the other RF feed channels that are not to be tuned are not active, or the other RF feed channels are not supplied with the RF feed voltage.

For tuning a plurality of resonant frequencies of RF feed channels of an RF coil, all resonant frequencies of each RF feed channel may be tuned together at the same time by applying an RF feed voltage to the resonant frequencies. The other resonant frequencies of the other RF feed channels that are not to be tuned are not active, or the other RF feed channels are not supplied with the RF feed voltage.

Upon output of an acoustic signal, the signal may contain an approximately frequency-constant basic tone (e.g., 1100 Hz). The frequency-constant basic tone is overlaid by a second frequency-variable tone (e.g., 100 Hz to 2000 Hz). The frequency of the second frequency-variable tone may be varied within a frequency band around the basic tone. The matching of the frequency-variable tone with the frequency-constant basic tone corresponds to the matching of the actual resonant frequency of the number of RF feed channels with the average required resonant frequency. The average required resonant frequency may be recognized by the operator with sufficient accuracy.

The signal to be output may be output on a service side of the MRT that lies opposite a patient side. The patient side is defined as the side of the MRT wherein the table with the patient may be moved into and moved out of the patient tunnel.

The device in accordance with the present teachings for signaling a tuning of a number of adjustment parameters of a coil arrangement of a magnetic resonance tomograph (MRT) may be developed such that the device further includes a modification unit configured for modification of an adjustment parameter. The adjustment parameter may be a number of electrical variables affecting a resonant circuit (e.g., capacitance, inductance, impedance) of a number of variable electrical components (e.g., capacitors, coils, resistors) of a coil arrangement (e.g., an RF transmit coil arrangement). The actual resonant frequency may thus be brought into a predefined tolerance frequency range located around the average required frequency.

The device in accordance with the present teachings contains a processing and control unit. In the processing and control unit, at least in a predefined tolerance frequency range located around an average-required resonant frequency, the difference between an actual resonant frequency and a required resonant frequency is determined and an acoustic and/or mechanical signal is output to an operator as a function of the leading sign and/or amount of the resonant frequency difference.

In some embodiments, the acoustic and/or optical signal may be selected manually in relation to the signal's varying characteristic variable by a wireless or a wired control unit. For example, a commercially available infrared remote control or a separate operating console connected to the device for conducting signals to signal the tuning of the MRT (e.g., having switches or pushbuttons) may be used. Alternatively, the alarm ball that is already present in most MRTs and that is intended for signaling by a patient lying in the patient tunnel who wishes to communicate with a current operator of the MRT during a later measurement may be used.

In some embodiments, the average required resonant frequency is predefined depending on the basic magnetic field (e.g., 1 T, 1.5 T or 3 T) and/or may be adjusted manually or automatically.

A representative individual adjustment of the BC parameters may include the following.

The tuning of a BC with two RF channels involves bringing three parameters into the specification/requirements: two frequency positions of the impedance of the BC channels (e.g., reflection and calibration) and one decoupling. The process may be implemented step-by-step as follows: the frequency of the reflection of the first channel, the frequency of the reflection of the second channel, and the decoupling between the channels. The service person may be given the opportunity of choosing between acoustic signaling modes (e.g., through a remote control head or a mini switch console) that are disposed close to the service side of the BC. If a remote control is too expensive, complex, or complicated to operate and the remote control is easily lost, the "alarm ball" that is connected to the pneumatic switches of the patient table may be used.

A "beat" as acoustic signaling to the operator is described in greater detail below as a first example:

For frequency tuning, a constant basic tone (e.g., 1100 Hz) may be created through a loudspeaker of the communications system (e.g., of the MRT). The constant basic tone has an adjustable amplitude. The service person may freely define the amplitude to adapt the amplitude to the person's hearing. A second tone of a frequency between 100 and 2000 Hz may be superimposed on the first basic tone. The frequency of the second tone may depend on the deviation between the specified/required RF average frequency of the system and the current RF frequency.

If the deviation from the specification/requirement is large, the two frequencies will be clearly separated from one another. As soon as the frequencies come closer to one another during the tuning process, a beat may arise. When the frequencies are exactly identical, the beat is lost. Loss of the beat indicates precisely the coincidence of the defined and the specified/required frequency. Each deviation from the target frequency is readily recognizable because the sound/tone is heard going into a higher or lower distance in relation to the 1100 Hz basic tone as a function of the position of the frequency of the respective channel, and the beat becomes stronger.

The adjustment of the decoupling frequency is less involved. To tune the decoupling, only one single tone may suffice. The amplitude of the tone may be closely related to the magnitude of the decoupling. As described above, additional information may be given to the service person by defining the spacing of the individual tone to a value related to the frequency of the maximum of the decoupling.

A "clicking" via tone bursts or a pulse sequence of tones as acoustic signaling to the operator is described below in a second example:

A sequence of tone bursts is transmitted. There is a specific pulse length in the time and frequency during a tone burst. The frequency within individual tone bursts may be related to the deviation from the specified/required RF average frequency of the system. The primary measure of degree may be the repetition rate of the acoustic tone burst.

The tone burst scenario may also be used for the adjustment of the decoupling. Considerations in relation to the psychological effect of the tone burst repetition rate are described below:

Either a rule is selected stating that
"high repetition rate=good definition, and
low repetition rate=bad definition"
or, conversely, a rule is selected stating that
"low repetition rate=good definition, and
high repetition rate (=alarm signaling)=bad definition".

The frequency of the tone bursts themselves may be related to the frequency of the maximum of the decoupling, although this is not necessarily the case. For example, instead of the tone bursts of a specified or required tone frequency with a length of a few hundred milliseconds, very short clicks may be used. Analogous to the decoupling peaks, the clicks may become faster or slower as desired. For example, when the decoupling reaches a maximum, the beat may be faster. When the decoupling decreases (e.g., is less negative), the clicks become slower.

A combined tuning of the frequencies and the decoupling of the number of RF channels with acoustic signaling to the operator is described below in a third example:

After, for example, the two reflection frequencies and the decoupling have been brought close to the specification/requirement, the service person may wish to carry out fine-tuning. As a result, and because of the high effective connections (interactivity) between the factors to be adjusted (frequency definition has a non-linear influence on the decoupling magnitude), the combined information of two or all three measured amounts may be needed. The information may be acoustically coded through a consecutive combination of the above-described tones. For example, during an interval of three seconds, an operator may hear a beat or pulse sequence for the first RF channel, a second beat or pulse sequence of the second RF channel, and a third sudden click or a third pulse sequence for the decoupling.

An advantage of a method as described herein is that feedback is given to the service person during the tuning of the BC. The provision of such feedback is a timesaving factor, and the method may also greatly improve the quality of the tuning method itself. The method facilitates closed repetition loops (iterations) of the tuning method (in the circuit). Without feedback, the service person may reach only the edge of the specification/requirements but not be in a position or have the time to find the optimum definition. The provision of real-time feedback relating to all dimensions to be optimized allows the service person to easily find the optimum balance of the interacting data/amounts to be tuned. In addition, the service person may adjust the values to be tuned even beyond the specification/requirement values if the values become bad, and thus return to the optimum definition.

The above described method of acoustic feedback signaling does not distract the visual attention of the service person from the knobs to be turned and does not need any further hardware. A loudspeaker already exists for communication with the patient. The measurement device for measuring the reflection and decoupling likewise exists, as does the "alarm ball" connected to the patient table. The use of existing elements for tuning purposes does not adversely affect the intended primary use of those elements.

BRIEF DESCRIPTION OF THE DRAWINGS

FIG. 1 shows an example of magnetic resonance tomograph, and an example of device for signaling tuning of a number of adjustment parameters of a coil arrangement of the magnetic resonance tomograph. FIG. 1 is not drawn true-to-scale.

DETAILED DESCRIPTION

As shown in FIG. 1, an approximately circular cylindrical magnetic resonance tomograph 1 includes, from a radially outer side to a radially inner side, a basic field magnet coil 2 configured for creating a constant permanent magnetic or electromagnetic basic field (B0). Three gradient coils 4 are configured for creating linearly increasing or decreasing electromagnetic gradient fields (Bx, By, Bz) in the three spatial directions x, y, z. A body coil (BC) 6 is configured for creating an electromagnetic RF alternating field (B1) via at least one RF feed line (not shown). The body coil 6 may be operated as a transmit and/or receive antenna and, in some embodiments, as a transmit antenna. A patient table 12 may be moved from the end-face side patient side 10 of the MRT 1 into the inner chamber 8 of the coils. The inner chamber 8 of the coils is also referred to as the patient tunnel 8 (reference number 12'). The patient table may be moved completely out of the chamber again (reference number 12). The MRT measurement (MRT scan) is made while the patient table 12 is moving or stationary. The patient table 12 moved fully out of the patient tunnel 8 is labeled with the reference number 12. The same patient table 12 moved fully into the patient tunnel 8 is labeled with the reference number 12'. The patient table 12 is movably supported on a table foot 14 in a longitudinal directions 16 (in spatial direction z).

Mostly smaller local coils (LC) (not shown) may be disposed on the patient table 12 or on the patient (not shown). The local coils may be operated as transmit and/or receive antennae and, in some embodiments, as receive antennae.

A seated service person 18 (a.k.a., an "operator" 18) is shown on the end-face service side 20 of the MRT 1. The end-face service side 20 lies opposite the patient side 10.

A measurement, processing, control, and regulation system of the MRT 1 is provided in the table foot 14. The system is used for the diagnostic operation of the MRT 1 with a patient but also for the settings of the MRT 1 without a patient. A display is operated by the measurement, processing, control, and regulation system on the outside of the basic magnetic field coil 2 on the patient side 10. A plurality of measured and/or calculated and/or determined values may be displayed as numerical values or diagrams. Patient images may also be displayed. The patient data may be previously recorded as raw data and subsequently reconstructed from the raw data.

The measurement, processing, control, and regulation system of the MRT 1 \ contains a device in accordance with the present teachings, or may be equipped with a computer program product in accordance with the present teachings.

A room loudspeaker 24, a signal output 26 for headphones 28, and a signal input 30 for an alarm ball 32 are disposed in the area of the table foot 14.

The signal output 26 for the headphones 28 and the signal input 30 for the alarm ball 32 located on the patient side 10 are connected via first signal-conducting connection 34 and second signal-conducting connection 36 to the operator 18 on the service side 20. The first signal-conducting connection 34 and the second signal-conducting connection 36 may be between 2 m and 10 m long or even longer.

The operator 18 may use an adjustment tool 38. In FIG. 1, the adjustment tool 38 is shown as a relatively long (e.g., about 50-cm long) screwdriver. The adjustment tool 38 may be used to adjust the trimmer capacitors (not shown) that are located in the upper and/or lower ring sector (e.g., at between 10 o'clock and 2 o'clock about 1.2 m in height) of the annular intermediate space 40 between the gradient coils 4 and the body coil 6, or that are accessible from this location. The trimmer capacitors are part of the body coil 6 that may serve as an RF transmitter coil.

The reason for adjusting the trimmer capacitors is to tune the adjustment parameters, as described above.

As shown in FIG. 1, the operator 18 may not see the display 22 on the patient side 10 since the operator 18 is located on the service side 20 to perform the tuning.

Thus, in accordance with the present teachings, the operator 18 is given the necessary acoustic and/or mechanical information via the run loudspeaker 24 and/or the headphones 28. With the aid of the alarm ball 32, the operator 18 may communicate switching commands to the device to, for example, switch between different signaling types.

The method and device shown and described in detail herein are merely exemplary, and may be modified in a wide variety of ways without departing from the spirit and scope of the present teachings. For example, the present teachings may also be used for other types of magnetic resonance tomographs (e.g., magnetic resonance tomographs that open to the side).

It is to be understood that the use herein of indefinite articles such as "a" or "an" does not preclude the features described with such articles from being present in a plurality. In addition, the terms "unit" and "module" do not preclude the components involved from having a number of interacting subcomponents that may be spatially distributed.

While the present invention has been described above by reference to various embodiments, it should be understood that many changes and modifications may be made to the described embodiments. It is therefore intended that the foregoing description be regarded as illustrative rather than limiting, and that it be understood that all equivalents and/or combinations of embodiments are intended to be included in this description.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding claim—whether independent or dependent—and that such new combinations are to be understood as forming a part of the present specification.

The invention claimed is:

1. A method for signaling a tuning of an adjustment parameter of an antenna coil arrangement of a magnetic resonance tomograph (MRT), the method comprising:
   detecting, by a processor, a deviation of an actual adjustment value of at least one adjustment parameter from a required adjustment value of the at least one adjustment parameter; and
   outputting, by the processor, a signal in real time to an operator as a function of the deviation, the tuning of the at least one adjustment parameter of the antenna coil arrangement of the MRT being performable by the operator depending on the output signal, wherein the signal is selected from the group consisting of an acoustic signal, a mechanical signal, and a combination thereof, and wherein the tuning of the at least one adjustment parameter is interruptable or endable by the operator in response to receiving the signal, such that the actual adjustment value does not deviate further from the required adjustment value of the at least one adjustment parameter.

2. The method of claim 1, wherein the at least one adjustment parameter comprises a resonant frequency of at least one coil of the antenna coil arrangement.

3. The method of claim 1, wherein the at least one adjustment parameter comprises a decoupling factor between at least two coils of the antenna coil arrangement.

4. The method of claim 3, wherein the decoupling factor is tunable by the operator, such that the actual adjustment value lies within a predefined frequency-magnitude area in a frequency-magnitude diagram.

5. The method of claim 1, further comprising assigning the at least one adjustment parameter a characteristic variable of the output signal to be varied as a function of the deviation.

6. The method of claim 5, further comprising assigning different respective adjustment parameters to different characteristic variables.

7. The method of claim 5, wherein the characteristic variable of the output signal is selected from the group consisting of a basic frequency of the output signal, an amplitude of the output signal, a repetition frequency of a pulse sequence of the output signal, a pulse number of a pulse sequence of the output signal, and a beat of at least two overlaid output signals.

8. The method of claim 1, wherein the at least one adjustment parameter comprises at least one resonant frequency of an electrical resonant circuit of a variable electrical component, the method further comprising:
   displaying to the operator by the output signal an approximation of an actual resonant frequency to a predefined tolerance frequency range located around an average required resonant frequency, a required resonant frequency, or the average required resonant frequency and the required resonant frequency.

9. The method of claim 8, further comprising:
   displaying, by the output signal, a difference between the actual resonant frequency and the average required resonant frequency;
   wherein the output signal changes when there is a change in the difference between the actual resonant frequency and the average required resonant frequency.

10. The method of claim 1, wherein a plurality of resonant frequencies are tunable by the operator;
   wherein, during the tuning of the plurality of resonant frequencies, either (a) each resonant frequency of the plurality of resonant frequencies is tuned individually per se, (b) one or more resonant frequencies of the plurality of resonant frequencies is tuned, or (c) all resonant frequencies of the plurality of resonant frequencies are tuned simultaneously; and
   wherein resonant frequencies that are not to be tuned are not active.

11. The method of claim 1, wherein the acoustic signal comprises a frequency-constant basic tone that is overlaid by a second frequency-variable tone, wherein a frequency of the second frequency-variable tone is variable within a frequency band around a basic tone.

12. The method of claim 1, wherein the signal is output on a service side of the magnetic resonance tomograph, wherein the service side lies opposite a patient side.

13. A device configured for signaling a tuning of an adjustment parameter of a coil arrangement of a magnetic resonance tomograph (MRT), the device comprising:
a detection unit configured for detection of an actual adjustment value of at least one adjustment parameter;
an establishing unit configured for establishing a deviation of the detected actual adjustment value of the at least one adjustment parameter from a predefined required adjustment value of the at least one adjustment parameter; and
a signal generation unit configured for creating a signal in real time for an operator as a function of the deviation, wherein the tuning of the at least one adjustment parameter of the antenna coil arrangement of the MRT is tunable by the operator depending on the output signal, wherein the signal is selected from the group consisting of an acoustic signal, a mechanical signal, and a combination thereof, and wherein the tuning of the at least one adjustment parameter is interruptable or endable by the operator in response to receiving the signal, such that the actual adjustment value does not deviate further from the predefined required adjustment value of the at least one adjustment parameter.

14. A magnetic resonance tomograph comprising a device for signaling a tuning of an adjustment parameter of a coil arrangement of the magnetic resonance tomograph (MRT), wherein the device comprises:
a detection unit configured for detection of an actual adjustment value of at least one adjustment parameter;
an establishing unit configured for establishing a deviation of the detected actual adjustment value of the at least one adjustment parameter from a predefined required adjustment value of the at least one adjustment parameter; and
a signal generation unit configured for creating a signal in real time for an operator as a function of the deviation, the tuning of the at least one adjustment parameter of the antenna coil arrangement of the MRT being tunable by the operator depending on the output signal, wherein the signal is selected from the group consisting of an acoustic signal, a mechanical signal, and a combination thereof, and wherein the tuning of the at least one adjustment parameter is interruptable or endable in response to receiving the signal, such that the actual adjustment value does not deviate further from the predefined required adjustment value of the at least one adjustment parameter.

15. A non-transitory computer program product configured for loading into a processor of a programmable control device of a magnetic resonance tomograph (MRT), the non-transitory computer program product having stored therein data representing instructions executable by the processor for signaling a tuning of an adjustment parameter of an antenna coil arrangement of the magnetic resonance tomograph, the non-transitory computer program product comprising instructions for:
detecting a deviation of an actual adjustment value of at least one adjustment parameter from a required adjustment value of the at least one adjustment parameter; and
outputting a signal in real time to an operator as a function of the deviation, the tuning of the at least one adjustment parameter of the antenna coil arrangement of the MRT being performable by the operator depending on the output signal, wherein the signal is selected from the group consisting of an acoustic signal, a mechanical signal, and a combination thereof, and wherein the tuning of the at least one adjustment parameter is interruptable or endable by the operator in response to receiving the signal, such that the actual adjustment value does not deviate further from the required adjustment value of the at least one adjustment parameter.

16. The method of claim 2, wherein the at least one adjustment parameter comprises a decoupling factor between at least two coils of the antenna coil arrangement.

17. The method of claim 16, wherein the decoupling factor is tunable such that the actual adjustment value lies within a predefined frequency-magnitude area in a frequency-magnitude diagram.

18. The method of claim 2, further comprising assigning the at least one adjustment parameter a characteristic variable of the output signal to be varied as a function of the deviation.

19. The method of claim 3, further comprising assigning the at least one adjustment parameter a characteristic variable of the output signal to be varied as a function of the deviation.

20. The method of claim 4, further comprising assigning the at least one adjustment parameter a characteristic variable of the output signal to be varied as a function of the deviation.

* * * * *